Figure 1:
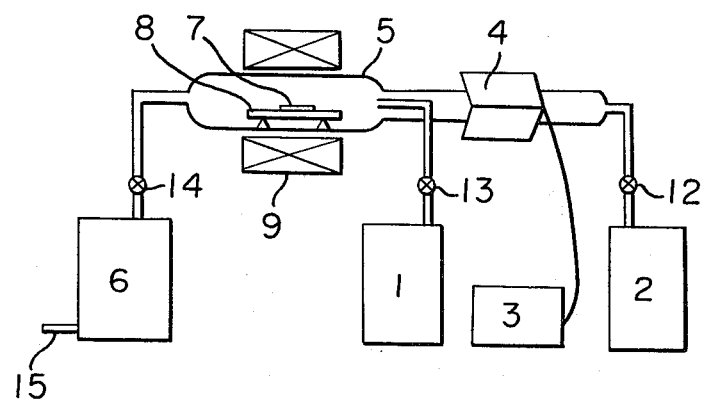

United States Patent [19]

Kamo et al.

[11] 4,434,188
[45] Feb. 28, 1984

[54] METHOD FOR SYNTHESIZING DIAMOND

[75] Inventors: Mutsukazu Kamo, Tsuchiura; Seiichiro Matsumoto; Yoichiro Sato, both of Sakura; Nobuo Setaka, Nagareyama, all of Japan

[73] Assignee: National Institute for Researches in Inorganic Materials, Ibaraki, Japan

[21] Appl. No.: 442,506

[22] Filed: Nov. 17, 1982

[30] Foreign Application Priority Data

Dec. 17, 1981 [JP] Japan .................. 56-204321
Jun. 24, 1982 [JP] Japan .................. 57-109044

[51] Int. Cl.³ ............................................. B05D 3/14
[52] U.S. Cl. .................................. 427/39; 427/113; 427/122; 423/446; 204/173
[58] Field of Search ............... 427/38, 39, 122, 113; 204/168, 173; 423/446

[56] References Cited

U.S. PATENT DOCUMENTS

| | | | |
|---|---|---|---|
| 3,661,526 | 5/1972 | Angus et al. | 423/446 |
| 4,191,735 | 3/1980 | Nelson et al. | 423/446 |
| 4,382,100 | 5/1983 | Holland | 427/39 |

OTHER PUBLICATIONS

Thin Solid Films, v. 58, (1979), pp. 107–116, Elsevier Sequoia, S. A., Lausanne.
Journal of Crystal Growth, v52, (1981), pp. 219–226.
Crystal Research and Technology, v16, #7, (1981), pp. 785–788.
Journal of Crystall Growth, v47, (1979), pp. 421–426.
J. Appl. Phys. v52, (#10), Oct. 1981, pp. 6151–6157.

*Primary Examiner*—John H. Newsome
*Attorney, Agent, or Firm*—Oblon, Fisher, Spivak, McClelland & Maier

[57] ABSTRACT

A method for synthesizing diamond wherein hydrogen gas which has passed through a micro-wave non-electrode discharge and mixed with hydrocarbon gas, or a mixture gas consisting of hydrocarbon and hydrogen after its passing through a micro-wave non-electrode discharge, is introduced onto the surface of a substrate heated to a temperature of from 300° to 1300° C. to decompose hydrocarbon in its energetically activated state for the diamond deposition.

5 Claims, 3 Drawing Figures

METHOD FOR SYNTHESIZING DIAMOND

This invention relates to a method for synthesizing diamond by chemical vapor deposition (CVD).

There have so far been known the following methods for synthesizing diamond at a low pressure region below the normal pressure.

(1) The chemical vapor deposition method, wherein hydrocarbon is introduced under a reduced pressure onto the surface of a heated substrate or pyrolyze the hydrocarbon by the thermal energy thereof and to produce free carbon, thereby depositing diamond on the substrate.

(2) The ion beam method, wherein positive ion beam of carbon is produced by the arc discharge and sputtering technique in combination, and the positive ion beam thus produced is accelerated, further converged, and impinged on the surface of the substrate, thereby depositing diamond.

(3) The plasma CVD method, wherein a discharge is generated across the electrodes, and electrons having high energy in the course of the electric discharge are utilized (for example, a high frequency micro-wave of 30 MHz or below, e.g., 13.5 MHz, is conducted through a mixture gas of hydrogen and hydrocarbon to generate a high frequency plasma, and the high energy charged particles of plasma are utilized) to release the chemical bonds in the hydrocarbon and to produce carbon atoms in an activated state, thereby depositing diamond on the surface of the substrate.

(4) The chemical transport method, wherein graphite, hydrogen gas and a substrate are sealed in a tube, in which graphite is placed at a high temperature section, and the substrate at a low temperature and atomic hydrogen is produced thermally or by an electric discharge, thereby depositing diamond on the surface of the substrate in utilization of a disproportionation chemical reaction.

Of the above-described various methods for the diamond synthesis, the chemical vapor deposition method (the method 1) forms a diamond layer on the surface of the substrate by thermal decomposition of hydrocarbon on the surface of the substrate heated to a temperature of 1100° C. or below under a reduced pressure, on account of which deposition of diamond and graphite carbon proceeds simultaneously, and graphite and non-diamond carbon, which are more stable than diamond, are unavoidably deposited. These deposited substances hinder the growth of diamond. Accordingly, for the synthesis of diamond, it is necessary to repeatedly perform the removing operations of graphite and non-diamond carbon deposited on the surface of the substrate by periodically introducing oxygen or hydrogen gas. Therefore, this method is disadvantageous in that the deposition rate is low and the substrate to be used is limited to diamond.

The ion-beam method (the method 2) has an advantage such that diamond can be deposited on the surface of the substrate of various sorts of material at a normal temperature, while it has such disadvantages that a device for generating positive ion beam of carbon and a device for converging the ion beam are very expensive, and the atoms of an inactive gas such as argon gas, etc. to be used for continuing the electric discharge are taken inside the lattices of diamond as deposited.

The high frequency plasma CVD method (the method 3), wherein high frequency plasma is periodically generated in synchronism with introduction of a reaction gas to synthesize diamond, is difficult to uniformly maintain the plasma density over the entire area of the substrate. On account of this inhomogeneity in the plasma density, there is a possibility of non-diamond carbon being disadvantageously deposited, besides diamond. This method is further disadvantageous in that, in order to generate the plasma, a pressure in the reaction system should be in a narrow range of low pressure level and no plasma is generated when the pressure is high, and that matching should constantly be taken between the high frequency generator and the plasma to avoid any discrepancy in it.

The chemical transport method (the method 4) is basically a sealed tube method which utilizes hydrocarbon produced from reaction between graphite and atomic hydrogen in the sealed tube, on account of which the method has various disadvantages such that no continuous deposition operation can be done, and the synthesizing conditions such as concentration and ratio of the reaction gas, and heating temperature, etc. cannot be varied independently.

The method of the present invention is to improve various shortcomings inherent in the above-described conventional methods, and is directed to provide an improved method for stably synthesizing granular or film-like diamond on the surface of the substrate, in which the synthesizing conditions such as concentration and ratio of the reaction gas, heating temperature, pressure in the reaction system, and so forth can be readily varied independently of the other.

Furthermore, the present inventors conducted further searches to overcome various difficulties as noted above, and have found out that, when a micro-wave of 300 MHz and above is introduced into hydrogen gas or a mixture gas of hydrogen and an inactive gas to generate a micro-wave plasma, and then the substrate is placed in the micro-wave plasma, the substrate can be heated to a temperature range of from 300° to 1300° C. required for decomposition of the hydrocarbons and synthesis of diamond, without necessity for subjecting the same to any other heating operation. It has also been found out that, by mixing an inactive gas with hydrogen gas, the growth of diamond can be adjusted. The present invention has been completed on the basis of these discoveries.

According to the present invention, in one aspect thereof, there is provided a method for synthesizing diamond, characterised in that hydrogen gas which has passed through a micro-wave non-electrode discharge and mixed with hydrocarbon gas, or a mixture gas consisting of hydrocarbon and hydrogen after its passing through a micro-wave non-electrode discharge, is introduced onto the surface of a substrate heated to a temperature range of from 300° to 1300° C. to thermally decompose the hydrocarbon in its excited state for deposition of diamond.

According to the present invention, in another aspect thereof, there is provided a method for synthesizing diamond, characterized in that a micro-wave of 300 MHz and above is introduced into hydrogen gas or a mixture gas consisting of hydrogen gas and an inactive gas to generate a micro-wave plasma, then a substrate is placed in the micro-wave plasma thus generated to heat the substrate to a temperature of from 300° to 1300° C. with heat generated by the micro-wave plasma, and hydrocarbon is introduced into the micro-wave plasma to thermally decompose the same, thereby depositing diamond on the surface of the substrate.

Figure 2:
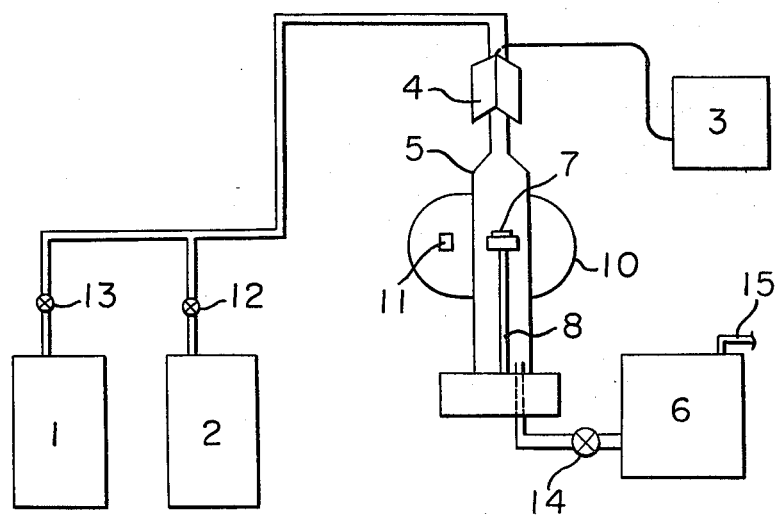
Figure 3:
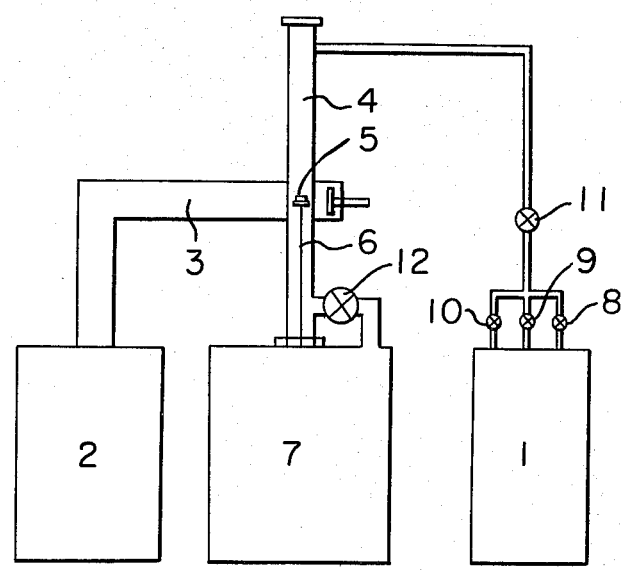

The foregoing objects, other objects, and features of the present invention will become clearer from the following detailed description of illustrative embodiments of the present invention, when read in conjunction with the accompanying drawings, in which:

FIGS. 1, 2 and 3 respectively illustrate systems for synthesizing diamond to put the method of the present invention into practice.

In the following, the present invention will be described in detail in reference to a few preferred embodiments thereof.

First of all, the principle of the diamond synthesis according to the present invention is as follows. In order for diamond to be synthesized at and under a thermodynamically stable temperature and pressure of graphite, the following conditions should be satisfied: (1) individually isolated carbon atoms be produced; (2) these carbon atoms be in an energetically activated state; (3) such energetically activated state be maintained until a diamond nucleous is formed; and others. Furthermore, in order to grow diamond from free carbon which has been produced by thermal decomposition of hydrocarbon, it is necessary that energy of reaction is sufficient to produce $sp^3$ bonding between carbon atoms.

In the method according to the present invention, hydrogen gas which has passed through micro-wave non-electrode discharge is mixed with hydrocarbon, or hydrocarbon and hydrogen gas are mixed together, after which the mixture gas is passed through the micro-wave non-electrode discharge, thereby producing hydrocarbon in an energetically activated state, and hydrogen in its energetically activated state or its atomic state. This energetically activated hydrocarbon supplies a reaction energy sufficient to bring about the $sp^3$ bonding in free carbon atoms to be produced when the hydrocarbon is pyrolysed on the surface of a heated substrate. Also, the energetically activated or atomic hydrogen reacts with a nucleous having the $sp^2$ or $sp$ bonding, which makes a cause for growth of graphite and non-diamond carbon, to convert this nucleous to the $sp^3$ bonding or to produce hydrocarbon.

In this way, the hydrogen functions to clean the surface where diamond grows.

In the method of the present invention, micro-wave non-electrode discharge is adopted for maintaining a stable electric discharge. Since the d.c. discharge should utilize electrodes, generation of electric discharge over a long period of time in succession is difficult because of damage to be caused to the electrodes. Further, generation of non-electrode discharge with a frequency of several tens of MHz or below depends considerably on the pressure level in the synthesizing system. In this connection, the micro-wave non-electrode discharge serves to reduce the dependency on the pressure of the system.

A frequency of several tens of MHz is not sufficient to give hydrocarbon a satisfactory activated state for depositing diamond.

While a mixing ratio between hydrocarbon and hydrogen gas in the mixture gas for use may be varied in a wide range, it is desirable that the upper limit thereof be 10 or below from the standpoint of preventing graphite and non-diamond carbon from deposition. And, in order to synthesize granular diamond, the ratio should preferably be approximately 0.05 or below, and for depositing a film-like diamond, it should preferably be approximately 0.05 and above.

A temperature of the substrate is required to be at a level which serves to prevent a reversing phenomenon of diamond as deposited to graphite, and also to pyrolyse the energetically activated hydrocarbon on the surface of the substrate. It is desirable to be in a range of from 300° to 1300° C., and, more particularly, from 500° to 1000° C.

A pressure within a tube to generate the non-electrode discharge should preferably be in a range of from 0.05 to 400 Torr for maintaining a stable discharge.

The method according to the present invention adopts an open tube method, in which the quantity of production of the energetically activated hydrocarbon, hydrogen, and the atomic hydrogen can be controlled independently of the other by adjusting the mixing ratio between hydrocarbon and hydrogen gas, flow rate of the gases, the temperature of the substrate, and an output from a micro-wave oscillator, whereby the nucleous forming speed can be easily controlled. By controlling the nucleous forming speed, there can be readily synthesized the granular or film-like diamond.

In the following, explanations will be given in reference to FIGS. 1 and 2 of the accompanying drawing as to preferred embodiments of a device to carry out the method according to the present invention.

FIG. 1 illustrates a system, in which hydrogen gas after its passage through a micro-wave non-electrode discharge is mixed with hydrocarbon gas, while FIG. 2 shows a system, in which a mixture gas of hydrocarbon and hydrogen gas is caused to pass through the micro-wave non-electrode discharge.

In FIGS. 1 and 2, a reference numeral 1 designates a hydrocarbon gas supplying device, a numeral 2 refers to a hydrogen gas supplying device, 3 denotes a microwave oscillator, 4 a wave guide, 5 a reaction chamber, and 6 a gas evacuation device. In the deposition chamber 5, there is installed a supporting table 8, on which a substrate 7 is mounted. In the embodiment of FIG. 1, the substrate 7 is heated by a resistive heating furnace 9. In the embodiment of FIG. 2, the heating of the substrate is effected by an infrared ray converged irradiation furnace 10 which collects light emitted from a halogen lamp. Reference numerals 12, 13 and 14 designate respectively cocks for regulating a flow rate of hydrogen gas, a flowrate of hydrocarbon gas, and a pressure within the device. A numeral 15 refers to a gas evacuation port.

After the substrate 7 has been mounted on the supporting table 8 in the reaction chamber, the gas evacuation device 6 is actuated to reduce the pressure within the device, and, at the same time, the cocks 12, and 14 are regulated to maintain the flow rate of hydrogen gas and the pressure within the device at predetermined values. Subsequently, the temperature of the substrate is maintained at a predetermined level by the resistive heating furnace 9. In the case of using the infrared ray converged irradiation furnace, the substrate temperature is controlled by regulating electric current flowing in the halogen lamp 11. Then, the micro-wave oscillator 3 is actuated to generate micro-wave non-electrode discharge with simultaneous introduction of hydrocarbon gas which has been adjusted its quantity in advance.

In still another method of the diamond synthesis according to the present invention, a micro-wave having a frequency of 300 MHz to 1,000 GHz is introduced into hydrogen gas or a mixture gas consisting of hydrogen gas and an inactive gas to thereby generate a micro-wave plasma. On account of this, stable generation of the micro-wave plasma can be attained with less energy loss than in the conventional high frequency plasma of a frequency of 30 MHz or below, with a low output of from 200 W to 5 kW, or preferably from 300 W to 1.5 kW, and in a broad range of pressure reduction. Also, a large quantity of energetically activated hydrocarbon can be produced without necessity for the electrodes. Moreover, the substrate can be heated by this micro-wave to a temperature of from 300° to 1300° C., at which the diamond is deposited, without necessity for any other heating expedient. The hydrocarbon which is introduced into this substrate is brought to an energetically activated state by the micro-wave plamsa, and is decomposed by this heated substrate to produce carbon atoms in an energetically activated state. That is to say, the carbon atoms are in possession of the reaction energy sufficient to cause the chemical bonding of diamond, from which desired diamond is yielded. Furthermore, hydrogen, which has been generated in the micro-wave plasma and which is in an energetically activated state or in an atomic state, reacts with carbon atoms having the $sp^2$ and sp bonding which cause graphite and graphite carbon to grow to produce hydrocarbon, and, at the same time, separates from the surface of the substrate to perform the cleaning action on the surface where diamond produces, thereby preventing impurity from mixing into the diamond structure.

Also, as mentioned above, since no other heating device than the micro-wave is required for heating the substrate, the device for the diamond growth becomes simple in construction and its operation becomes facilitated.

Incidentally, the inactive gas to be mixed with hydrogen such as, for example, argon, possesses a function of adjusting the growth of diamond. Such inactive gas is mixed with hydrogen for use in a predetermined ratio depending on the shape of diamond as desired.

The hydrocarbon for use in the present invention should preferably be methane gas from the point of its being obtainable readily at a low price, although any kind of hydrocarbon may be used, if it is decomposed at the temperature of the heated substrate to produce carbon. Examples of the hydrocarbon are: ethane, propane, ethylene, acetylene, benzene, and other hydrocarbons.

A volumetric ratio between hydrocarbon (A) and hydrogen (B) may be in a wide useful range of $A/B=500$ to 0.001. However, from the standpoint of preventing deposition of graphitic carbon, its upper limit should preferably be 10 and below. Also, for the synthesis of granular diamond, the ratio should preferably be 0.05 and below, and, for the synthesis of film-like diamond, it should preferably be greater than 0.05.

A volumetric ratio for use of hydrogen gas (B), inactive gas (C) and hydrocarbon (A) should preferably be $A/(B+C)=500$ to 0.001, and substitution of C to B should preferably be 50% or below.

The micro-wave is in a frequency range of from 300 MHz to 1,000 GHz. An output range of the micro-wave is from 200 W to 5 kW, or, preferably, from 300 W to 1.5 kW.

The temperature of the substrate is required to be in a range of from 300° to 1300° C. If the temperature is below 300° C., there is an apprehension of hydrogen mixing into the diamond structure as deposited. When the temperature exceeds 1300° C., there takes place such a defect that the deposited diamond reversely transforms to graphite. Accordingly, the temperature range for the substrate should preferably be from 500° to 1200° C.

A pressure within the tube to generate the micro-wave plasma should preferably range from 0.05 to 400 Torr so as to maintain a stable plasma generation.

According to this method of the present invention, there are such advantageous effects, other than those as mentioned above, that, since the method is of the open tube method, the substrate temperature and the production quantity of energetically activated hydrocarbon, hydrogen, or atomic hydrogen can be controlled by regulating a mixing ratio of hydrocarbon and hydrogen, or a ratio of inactive gas to be mixed with these gases, the flow rate of the gases, and an output from the micro-wave oscillator. Accordingly, the nucleous forming speed of diamond can be readily controlled, by the control of which the granular diamond or the film-like diamond can be synthesized.

In the following, another embodiment of the device for synthesizing diamond to put the method of the present invention into practice will be explained in reference to FIG. 3. In the drawing, a reference numeral 1 designates a gas feeding device, and numerals 8, 9 and 10 are respectively cocks for feeding hydrocarbon gas, hydrogen gas, and inactive gas. A reference numeral 2 refers to a micro-wave oscillator. The micro-wave as generated passes through a wave guide 3 and reaches the top surface of the substrate 5 placed in a reaction chamber 4. A numeral 6 indicates a substrate supporting table, 7 refers to a gas evacuation device, and 11, 12 designate cocks.

The operation of the system is effected in the following manner: the substrate 5 is mounted on the substrate supporting table 6 in the reaction chamber 4, after which the gas evacuation device 7 is actuated to reduce the pressure within the reaction chamber 4; then, the cocks 8, 9 and 10 of the gas feeding device 1 are opened to let out hydrocarbon gas, hydrogen gas, and inactive gas; thereafter, the cocks 11 and 12 are also opened to regulate the flow rate and mixing ratio of the gases, while maintaining the pressure within the reaction chamber 4 at a predetermined value; and subsequently the micro-wave oscillator 2 is actuated to generate the micro-wave non-electrode discharge.

In order to enable those persons skilled in the art to put this invention into practice, the following few preferred examples are presented. It should however be understood that these examples are illustrative only, and do not constitute limitation to the scope of the present invention as recited in the appended claims.

EXAMPLE 1

There were used a molybdenum substrate, and methane and hydrogen as the reaction gas.

The gas evacuation device was actuated to reduce a pressure in the reaction system. Subsequently, hydrogen gas was supplied at a flow rate of 100 cc/min. and the cock 14 was controlled to adjust the pressure in the reaction system to 0.5 Torr. Then, a non-electrode electric discharge was generated by the micro-wave oscillator. Subsequently, the temperature of the substrate was elevated to 900° C., and, at the same time, methane gas was fed at a flow rate of 20 cc/min. to be mixed with hydrogen gas which had passed through the above mentioned non-electrode electric discharge, followed by its introduction onto the heated substrate. The deposition was carried out for three hours to obtain a deposited layer of diamond of a thickness of 1 μm or so on the surface of the substrate.

EXAMPLE 2

There were used a substrate of silicon wafer, and methane and hydrogen as the reaction gas.

The gas evacuation device was actuated to reduce a pressure in the reaction system. Subsequently, hydrogen gas and hydrocarbon gas were supplied at their respective flow rates of 100 cc/min. and 10 cc/min., while the cock 14 was adjusted to control the pressure within the reaction system to 0.1 Torr.

Then, a temperature of the substrate was elevated to 700° C., and, at the same time, the non-electrode electric discharge was generated by the micro-wave oscillator. The deposition was carried out for three hours to deposit the diamond particles having a diameter of 2 μm or so on the substrate surface.

EXAMPLE 3

The diamond synthesis was conducted by use of a device shown in FIG. 3, a silicon wafer as the substrate 5, and methane and hydrogen as the reaction gas.

The silicon wafer was mounted on the supporting table 6 for the substrate, and then the gas evacuation device 7 was actuated to reduce a pressure in the interior of the reaction chamber 4. Subsequently, both hydrogen gas and methane gas were supplied into the reaction chamber at their respective flow rates of 40 cc/min. and 7 cc/min. while regulating the cock 12 to adjust the pressure within the reaction chamber 4 to 30 Torr.

In the next place, the non-electrode discharge was generated by an output from the micro-wave oscillator 2 of 500 W and a frequency of 2,450 MHz to energetically activate the gases with simultaneous heating of the silicon wafer 5 to 950° C., on which diamond was deposited over a time period of three hours, whereupon diamond particles of 10 μm or so were deposited.

EXAMPLE 4

Using the device shown in FIG. 3, the substrate 5 of molybdenum, and hydrogen, methane and argon as the reaction gas, the diamond synthesis was conducted.

The molybdenum substrate was mounted on the supporting table 6, and then the gas evacuation device 7 was actuated to reduce a pressure in the interior of the reaction chamber 4. Subsequently, hydrogen, methane and argon gases were supplied into the reaction chamber at their respective flow rates of 20 cc/min., 10 cc/min., and 5 cc/min., while the cock 12 was adjusted to regulate the pressure within the reaction chamber 4 to 50 Torr.

In the next place, the non-electrode discharge was generated from the micro-wave oscillator 2 with an output of 600 W and a frequency of 2,450 MHz to thereby energetically activate the gases with simultaneous heating of the molybdenum substrate to 1050° C., onto which diamond was deposited over a period of three hours, whereupon a layer of diamond was deposited to a thickness of 1 μm or so.

We claim:

1. A method for synthesizing diamond, characterized in that hydrogen gas which has passed through a micro-wave non-electrode discharge and mixed with hydrocarbon gas, or a mixture gas consisting of hydrocarbon and hydrogen after its passing through a micro-wave non-electrode discharge, is introduced onto the surface of a substrate heated to a temperature of from 300° to 1300° C. to decompose hydrocarbon in its energetically activated state for the diamond deposition.

2. A method for synthesizing diamond, characterized in that a micro-wave of 300 MHz and above is introduced into hydrogen gas or a mixture gas consisting of hydrogen gas and an inactive gas to generate a micro-wave plasma, then a substrate is placed in the micro-wave plasma thus generated to thereby heat the substrate to a temperature of from 300° to 1300° C. with the thus generated heat by the micro-wave plasma, and, at the same time, hydrocarbon is introduced onto the substrate, thereby depositing diamond on the surface of the substrate.

3. The method for synthesizing diamond according to claim 1, wherein a mixing ratio in volume of hydrocarbon to hydrogen ranges from 100 to 0.001.

4. The method for synthesizing diamond according to claim 2, wherein a mixing ratio in volume of hydrocarbon to hydrogen ranges from 500 to 0.001.

5. The method for synthesizing diamond according to claim 2, wherein a mixing ratio in volume of hydrocarbon to hydrogen and inactive gas ranges from 500 to 0.001, with a substitution of inactive gas to hydrogen being 50% or below.

* * * * *